United States Patent
Zhang et al.

(10) Patent No.: US 10,921,191 B2
(45) Date of Patent: Feb. 16, 2021

(54) ATOMIC SENSING METHOD AND CHIP-SCALE ATOMIC SENSOR

(71) Applicant: Wuhan Institute of Physics and Mathematics, Chinese Academy of Science, Wuhan (CN)

(72) Inventors: Yi Zhang, Wuhan (CN); Sihong Gu, Wuhan (CN); Yuan Tian, Wuhan (CN); Jiehua Chen, Wuhan (CN)

(73) Assignee: WUHAN INSTITUTE OF PHYSICS AND MATHEMATICS, CHINESE ACADEMY OF SCIENCE, Wuhan (CN)

( * ) Notice: Subject to any disclaimer, the term of this patent is extended or adjusted under 35 U.S.C. 154(b) by 0 days.

(21) Appl. No.: 16/798,414

(22) Filed: Feb. 23, 2020

(65) Prior Publication Data
US 2020/0271523 A1  Aug. 27, 2020

(51) Int. Cl.
| | |
|---|---|
| *G01J 4/00* | (2006.01) |
| *G01J 4/04* | (2006.01) |
| *G02B 27/28* | (2006.01) |
| *G01R 33/032* | (2006.01) |

(52) U.S. Cl.
CPC .............. *G01J 4/04* (2013.01); *G02B 27/283* (2013.01); *G02B 27/286* (2013.01); *G01R 33/0322* (2013.01)

(58) Field of Classification Search
CPC ...... G01N 21/21; G01N 21/211; G01N 21/23; G01J 4/04; G01J 4/00
USPC ........................................................ 356/364
See application file for complete search history.

(56) References Cited

U.S. PATENT DOCUMENTS

| | | | | |
|---|---|---|---|---|
| 2012/0262646 A1* | 10/2012 | Iwata | ................ | G02F 1/133536 349/64 |
| 2015/0130456 A1* | 5/2015 | Smith | .................... | G01R 33/26 324/301 |

* cited by examiner

*Primary Examiner* — Md M Rahman
(74) *Attorney, Agent, or Firm* — Matthias Scholl P.C.; Matthias Scholl

(57) ABSTRACT

An atomic sensing method, the method including providing a polarization converter; emitting a linearly polarized polychromatic laser beam to the polarization converter; converting, by the polarization converter, the linearly polarized polychromatic laser beam into a circularly-polarized laser beam and a linearly-polarized laser beam; combining the circularly-polarized laser beam and the linearly-polarized laser beam thereby yielding a multi-polarization polychromatic laser beam; transmitting the multi-polarization polychromatic laser beam to an atomic vapor cell comprising alkali metal atoms, polarizing the multi-polarization polychromatic laser beam into two laser beams, and detecting the two laser beams by two photodetectors, respectively.

11 Claims, 4 Drawing Sheets

ATOMIC SENSING METHOD AND CHIP-SCALE ATOMIC SENSOR

CROSS-REFERENCE TO RELATED APPLICATIONS

Pursuant to 35 U.S.C. § 119 and the Paris Convention Treaty, this application claims foreign priority to Chinese Patent Application No. 201910145714.4 filed Feb. 27, 2019, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The disclosure relates to the field of electromagnetic detection technology, and more particularly to an atomic sensing method and a chip-scale atomic sensor.

The atomic sensors polarize the atoms through optical pumping, and then detect the behavior of the polarized atoms in the magnetic field to obtain the information of the measured magnetic field or the angular velocity of a gyroscope. Specifically, two lasers output two laser beams of different intensity and frequency, respectively. The two laser beams are perpendicular to each other and interact with the atoms and polarize the atoms. The information of measured magnetic field or angular velocity is obtained by detecting the rotation degree of the polarization direction of the laser beams. However, the conventional atomic sensors include two lasers makes, so they are bulky and costly.

SUMMARY

The disclosure provides an atomic sensing method.

The method comprises providing a polarization converter; emitting a linearly polarized polychromatic laser beam to the polarization converter; converting, by the polarization converter, the linearly polarized polychromatic laser beam into a circularly-polarized laser beam and a linearly-polarized laser beam; combining the circularly-polarized laser beam and the linearly-polarized laser beam thereby yielding a multi-polarization polychromatic laser beam; transmitting the multi-polarization polychromatic laser beam to an atomic vapor cell comprising alkali metal atoms, polarizing the multi-polarization polychromatic laser beam into two laser beams, and detecting the two laser beams by two photodetectors, respectively.

The linearly polarized polychromatic laser beam can comprise a fundamental frequency component, a negative first-order sideband, and a positive first-order sideband; the fundamental frequency component is converted by the polarization converter into the circularly-polarized laser beam, and the negative and positive first-order sidebands are converted by the polarization converter into the linearly-polarized laser beam with two polarization directions perpendicular to each other. The linearly polarized polychromatic laser beam can be a tri-color laser beam, or a quasi-tri-color laser beam.

The linearly polarized polychromatic laser beam can be produced by a vertical cavity surface emitting laser (VCSEL).

The VCSEL is used as a light source, which means a chip-scale atomic sensor prepared according to the method can comprise a probe with a light source.

The laser light source has a certain amount of noise, and the VCSEL outputs a laser beam having a wide spectral output width and a large laser noise. The method polarizes the laser beam and eliminate the common mode noise.

The polarization converter (also called an orthogonal polarizer) is a cubic structure.

The linearly polarized polychromatic laser beam is converted by a polarization converter into a multi-polarization polychromatic laser beam of which the fundamental frequency component is converted into circular polarization light, while the positive first-order sideband frequency component and the negative first-order sideband frequency component are converted into two mutually perpendicular linear polarization light. The multi-polarization polychromatic laser beam interacts with the alkali metal atoms (such as rubidium, cesium, potassium, etc.) in the atomic vapor cell in the magnetic field. The fundamental frequency of strong circular polarization is used as a pump light to resonate with the alkali metal atoms. The alkali metal atoms are polarized by optical pumping. The positive first-order sideband frequency and negative first-order sideband frequency that are separately detuned from the atomic resonance are used as pump light to interact with the alkali metal atoms, and then the Faraday effect causes the plane of polarized pump light to rotate. The positive and negative detuning result rotation in opposite directions. The laser beam interacted with the alkali metal atoms is split by a polarizing beam-splitting prism into two beams which are then respectively detected by two photodetectors. The fundamental frequency of strong circular polarization and positive and negative first-order sidebands that are mutually perpendicular polarized are separated by equal intensities, when the light does not interact with the atoms. Therefore, the two photodetectors output photoelectric signals of equal intensity, and the differential signal obtained by subtracting the photoelectric signals each other is zero. But the positive and negative first-order sidebands rotate when the light interacts with the alkali metal atoms, and their rotation schemes are opposite due to the positive and negative detuning, respectively. The beam splitting effect of the polarizing beam-splitter prism is that the two sidebands contribute to one of split laser beams and decrease to the other. Therefore, the output photoelectric signals from the two photodetectors is subtracted each other, and the obtained differential signal is not zero. The non-zero differential signal is entirely derived from the optical rotation of the positive and negative first-order sidebands caused by atomic polarization in the magnetic field. The photoelectric signals are so sensitive to the magnetism and the changes of the magnetic field that can be used to develop atomic magnetometers and probes of atomic spin gyroscopes.

The disclosure also provides a polarization converter comprising a first polarization beam splitter; an atomic vapor cell comprising alkali metal atoms; a second polarization beam splitter; a first photodetector; and a second photodetector; the polarization converter, and the first photodetector and the second photodetector are disposed on two sides of the atomic vapor cell, respectively; the polarization converter is configured to convert a linearly polarized polychromatic laser beam into a circularly-polarized laser beam and a linearly-polarized laser beam with two polarization directions perpendicular to each other; the circularly-polarized laser beam and the linearly-polarized laser beam are combined to yield a multi-polarization polychromatic laser beam; the atomic vapor cell is configured to receive the multi-polarization polychromatic laser beam; the second polarization beam splitter is configured to polarize the multi-polarization polychromatic laser beam into two laser beams; and the first photodetector and the second photodetector are configured to detect the two laser beams by two photodetectors, respectively.

The first polarization beam splitter comprises a reflection optical path and a transmission optical path; the polarization converter comprises a first reflection waveplate and a second reflection waveplate disposed on the reflection optical path and the transmission optical path, respectively.

A first optical gasket is disposed between the first reflection waveplate and the first polarization beam splitter, and a second optical gasket is disposed between the second reflection waveplate and the first polarization beam splitter.

The first reflection waveplate and the second reflection waveplate are a quarter-wave plate coated with a reflection film on one surface.

The first reflection waveplate and the first polarization beam splitter are provided with a first optical gasket, and the second reflection waveplate and the first polarization beam splitter are provided with a second optical gasket.

Optical medium is a medium through which light can propagate. The use of gaskets indicates that the thickness of the optical medium is relatively thin. Different optical gaskets are used to adjust the optical path difference. The optical gasket is selected from gem, quartz, hollow tube (vacuum or gas-containing), etc.

A lens is disposed between the light output end of the polarization converter and the atomic vapor cell, and the lens is configured to convert a divergent light into a parallel light and output the parallel light.

The polarization converter also comprises a vertical cavity surface emitting laser. The vertical cavity surface emitting laser is disposed on the first polarization beam splitter. The laser beam output by a vertical cavity surface emitting laser or VCSEL comprises a fundamental frequency component, a negative first-order sideband and a positive first-order sideband. The output laser beam is a polychromatic light.

Every two adjacent optical elements of the device are adhered to one another.

VCSEL is used as a light source that outputs a linearly polarized frequency-modulated laser beam having a half divergence angle $\varphi$. The spectrum includes a fundamental frequency $f_0$, a negative first-order sideband with a frequency $f_{-1}$, and a positive first-order sideband with a frequency $f_{+1}$. The linearly polarized divergent laser beam enters the polarization converter. The polarization converter comprises a first polarization beam splitter, two quarter-wave plates with a reflection film on one surface, a hollow gasket, an optical gasket, a lens, and a support frame. The linearly polarized divergent laser beam enters the polarization converter; specifically, the laser beam enters the first polarization beam splitter (PBS). The first polarization beam splitter splits the laser beam into a reflected component and a transmitted component. The reflected component passes through the optical gasket, and then is reflected by the reflection surface of the first quarter-wave plate. The reflected component returns toward the first polarization beam splitter along the original optical path, that is, the reflected component passes through the wave plate portion of the first quarter-wave plate and the optical gasket in order, and then returns to the first polarization beam splitter.

The transmitted component passes through the hollow gasket, and then is reflected by the reflection surface of the second quarter-wave plate. Then the transmitted component returns toward the first polarization beam splitter along the original optical path, that is, the transmitted component passes through the wave plate portion of the second quarter-wave plate and the hollow gasket in order, and returns to the first polarization beam splitter. Then the transmitted component is reflected by the polarization reflection surface of the first polarization beam splitter and combined with the reflected component transmitted through the polarization reflection surface of the first polarization beam splitter. The combined light is a divergent light and is converted into parallel light after passing through the lens, and the support frame is configured to support the lens. The polarization converter is adjusted so that the fundamental frequency component of the combined light is circularly polarized light, and the positive and negative first-order sideband components respectively with frequencies $f_{-1}$ and $f_{+1}$ are two linearly polarized lights perpendicular to each other. After the combined parallel light enters the atomic vapor cell and interacts with the alkali metal atoms, the second polarization beam splitter splits the laser beam into two beams which are detected by the first photodetector and second photodetector, respectively, and the difference between the signals of the two photodetectors is used as output.

The fundamental frequency $f_0$, the negative first-order sideband frequency $f_{-1}$ and the positive first-order sideband frequency $f_{+1}$ satisfy the following relationships: $f_{+1}=f_0+f_m$, $f_{-1}=f_0-f_m$, where $f_m$ is a modulation frequency of the laser.

In the polarization converter, the polarization direction of the laser beam output by the VCSEL is 45° with respect to the transmission axis of the first polarization beam splitter. The outgoing light is divided into two beams of equal power by the first polarization beam splitter. The first polarizing beam splitter is a cube. The first quarter-wave plate and the second quarter-wave plate have the same size and comprise the same material. The optical gasket has a thickness of $d_1$ and a refractive index of no, and the thickness of the hollow gasket is $d_2$, wherein $d_1$, $n_0$, and $d_2$ satisfy the following relationship: $d_1 \times \cos \varphi = d_2 \times n_0 \times \cos (\sin^{-1} (\sin \varphi/n_0))$, so that the spots of the two laser beams that are combined after being split by the polarization reflection surface of the first polarization beam splitter have the same size. The optical path difference of the two laser beams is $2 \times \Delta L$, $\Delta L \approx (2 \times m + 1) \times c/(8 \times f_m)$, and $\Delta L \approx (2 \times n + 1) \times c/(4 \times f_0)$, where c is the speed of light, m and n are non-negative integers, preferably m=0. The lens focuses the divergent light into parallel light.

The atomic vapor cell is filled with alkali metal atoms. After the laser beam enters the atomic vapor cell from the polarization converter, the sideband with a fundamental frequency f0 resonates with the transition frequency of the alkali metal atoms, thereby causing the polarization of the alkali metal atoms. The positive and negative first-order sidebands (linearly polarized lights) polarized in two mutually perpendicular directions are detuned from the atomic resonance. The magnetic field or the angular velocity is measured by detecting the rotation of the laser's polarization plane caused by the alkali metal atoms.

The disclosure provides an atomic sensor for detecting an optical rotation of a polychromatic single laser beam. A polychromatic single laser beam output by a microwave-modulated vertical cavity surface emitting laser (VCSEL) is used as a light source. A fundamental frequency component of the single laser beam is converted into a pump light of circular polarization by a polarization converter. A positive first-order sideband frequency and a negative first-order sideband frequency are converted into two linearly polarized lights to detect optical rotation effects. The laser beam interacted with the alkali metal atoms in the magnetic field is split into two beams by a second polarizing beam-splitting prism, and then the output photoelectric signals are detected by two photodetectors, respectively. The photoelectric signals from the two photodetectors is subtracted each other to obtain a differential signal. The differential signal produced by the rotation direction of the polarization of the positive and negative first-order sideband components are extracted in a combined form. The fundamental frequency used in this disclosure is the original laser frequency. The difference between the positive and negative first-order sideband frequencies and the fundamental frequency is defined as a modulation frequency. A distribution of the light intensity between the fundamental frequency and the positive and negative first-order sideband frequency is determined by a modulation depth. Therefore, it is convenient to obtain circularly polarized light having the fundamental frequency that can resonate with the transition frequency of the alkali metal atoms, and also obtain linearly polarized light having the positive and negative first-order sidebands with an optimal detuning frequency. The interaction between the detuned light detuned light and the alkali metal atoms result in a negative impact on the detection accuracy because the optical frequency shift of the atomic transition spectrum occurs. The solution of polychromatic light employs a polychromatic light. The frequency shift caused by the polychromatic light with symmetrical frequency detuning of the positive and negative sidebands is much weaker than that of the single-sided detuning of the circular-line dual laser beam. Compared with the prior art, the disclosure improves the sensitivity of the sensor on the basis of simplifying a structure of a probe of an atomic sensor and reducing the volume and cost of the probe.

Figure 1:
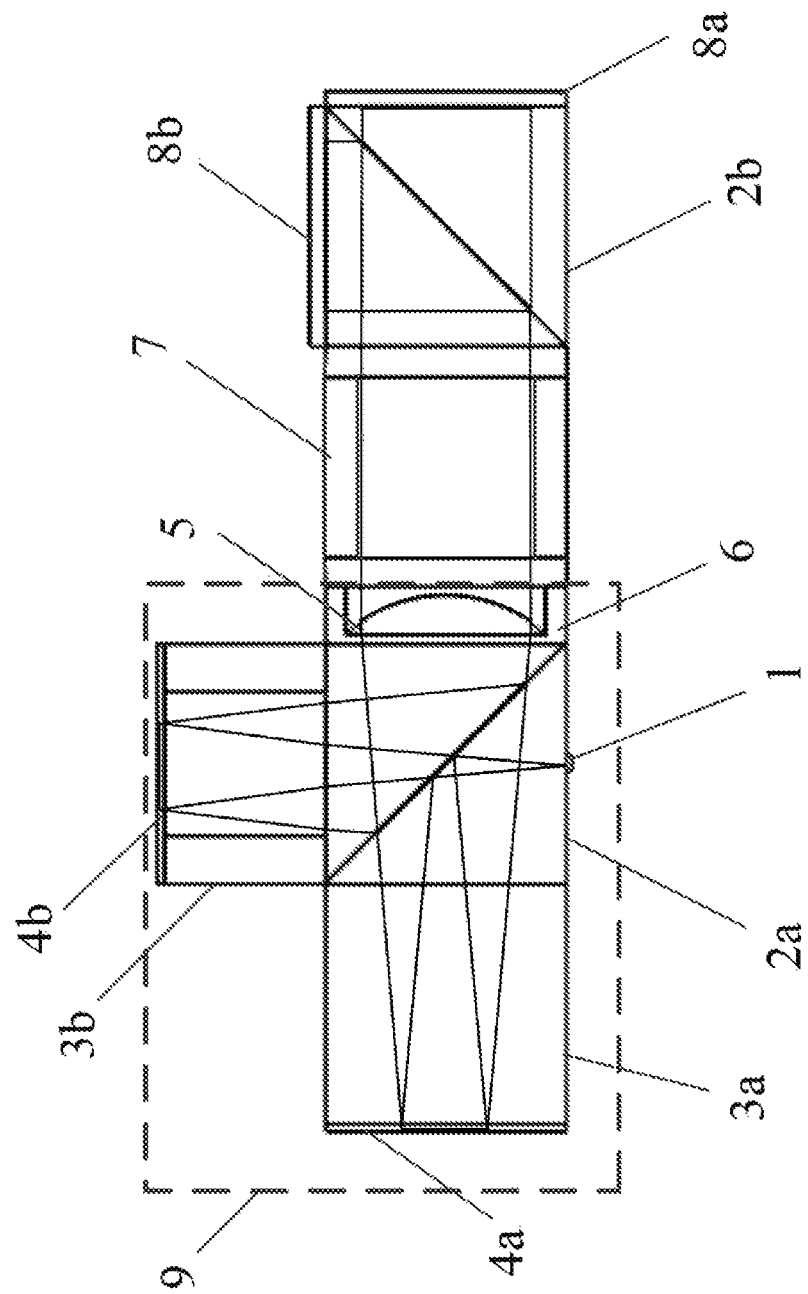
FIG. 1 shows a schematic diagram of a probe of a chip-scale atomic sensor according to one embodiment of the disclosure.

In the drawings, the following reference numbers are used: 1. VCSEL; 2a. First polarization beam splitter; 2b. Second polarization beam splitter; 3a. Optical gasket; 3b. Hollow gasket; 4a. First quarter-wave plate with a reflection film on one surface; 4b. Second quarter-wave plate with a reflection film on one surface; 5. Lens; 6. Support frame; 7. Atomic vapor cell; 8a. First photodetector; 8b. Second photodetector; 9. Polarization converter; L1. Outgoing light from a VCSEL; L2. Reflected laser beam in first PBS; L3. Transmitted laser beam in first PBS; L4 Laser beam reflected by optical gasket; L5. Laser beam reflected on hollow gasket; L6. Combined divergent laser beam; L7. Combined parallel laser beam; L8. Laser beam after interacting with alkali metal atoms; L9. Transmitted component for polarization analysis; L10. Reflected component for polarization analysis.

DETAILED DESCRIPTION OF THE EMBODIMENTS

FIG. 1 shows a schematic diagram of a probe of a chip-scale atomic sensor and a diagram of light propagation. A probe of an atomic sensor provided in the disclosure comprising a VCSEL 1, a first polarization beam splitter (PBS) 2a, a second PBS 2b, an optical gasket 3a, a hollow gasket 3b, a quarter-wave plate 4a with a reflection film on one surface, and a second quarter-wave plate 4b with a reflection film on one surface, a lens 5, a support frame 6, an atomic vapor cell 7, a first photodetector 8a and a second photodetector 8b. The first PBS 2a is in the shape of a cube, and the VCSEL 1 is adhesively connected to one surface (the incident surface of the laser beam) thereof, the hollow gasket 3b (hollow tube) is adhesively connected to the surface opposite to the incident surface of the laser beam; the second half-wave plate 4b is adhesively connected to the hollow gasket 3b; the optical gasket 3a (glass) is adhesively connected to the surface perpendicular to the incident surface of the laser beam; the first half-wave plate 4a is adhesively connected to optical gasket 3a; the support frame 6 is adhesively connected to another surface (the output surface of the combined light) perpendicular to the incident surface of the laser beam; the lens 5 is disposed on the support frame 6; the atomic vapor cell 7 is adhesively connected to lens support frame 6; the second PBS 2b is adhesively connected to the atomic vapor cell 7; the first photodetector 8a and the second photodetector 8b are adhesively connected to two mutually perpendicular surfaces of the second PBS 2b.

VCSEL is used as a light source that outputs a linearly polarized frequency-modulated polychromatic laser beam with a half divergence angle. The first polarization beam splitter 2a splits the laser beam into a reflected component and z transmitted component. The reflected component passes through the optical gasket 3a and the wave plate portion of the first quarter-wave plate 4a in order, and is reflected by the reflection surface of the first quarter-wave plate 4a. Then the reflected component returns toward the first polarization beam splitter along the original optical path: that is, the reflected component passes through the wave plate portion of the first quarter-wave plate 4a and the optical gasket 3a in order, and then returns to the first polarization beam splitter in which the reflected component passes through the polarization reflection surface of the first polarization beam splitter 2a. The transmitted component passes through the hollow gasket 3b and the wave plate portion of the second quarter-wave plate 4b in order, and is reflected by the reflection surface of the second quarter-wave plate 4b. Then the transmitted component returns toward the first polarization beam splitter along the original optical path: that is, the transmitted component passes through the wave plate portion of the second quarter-wave plate 4b and the hollow gasket 3b in order, and returns to the first polarization beam splitter. Then the transmitted component is reflected by the polarization reflection surface of the first polarization beam splitter 2a and combined with the reflected component transmitted through the polarization reflection surface of the first polarization beam splitter. The combined light, which is divergent light, is converted into combined parallel light by passing through the lens 5, and the support frame 6 is configured to support the space required by the lens. After the combined parallel light enters the atomic vapor cell 7 and interacts with the alkali metal atoms, the second polarization beam splitter 2b splits the laser light into two beams. The transmitted component for polarization analysis is detected by the first photodetector 8a, and the reflected component for polarization analysis is detected by the second photodetector 8b. In the dashed box in FIG. 1, the polarization converter 9 comprising the first PBS 2a, the optical gasket 3a, the hollow gasket 3b, the first quarter-wave plate 4a, the second quarter-wave plate 4b, the lens 5 and the support frame 6.

The first polarizing beam splitter 2a has the shape of a cube. The first quarter-wave plate 4a and the second quarter-wave plate 4b have the same size and comprise the same material. The optical gasket 3a has a thickness of $d_1$ and a refractive index of $n_0$, and the thickness of the hollow gasket is $d_2$, wherein $d_1$, $n_0$, and $d_2$ satisfy the following relationship: $d_1 = n_0 \times d_2$, which allows the spots of the laser beam L4 reflected by the optical gasket and the laser beam L5 reflected by the hollow gasket to have the same size when the two laser beams reach the polarization reflection surface of the first PBS 2a.

Figure 2A:
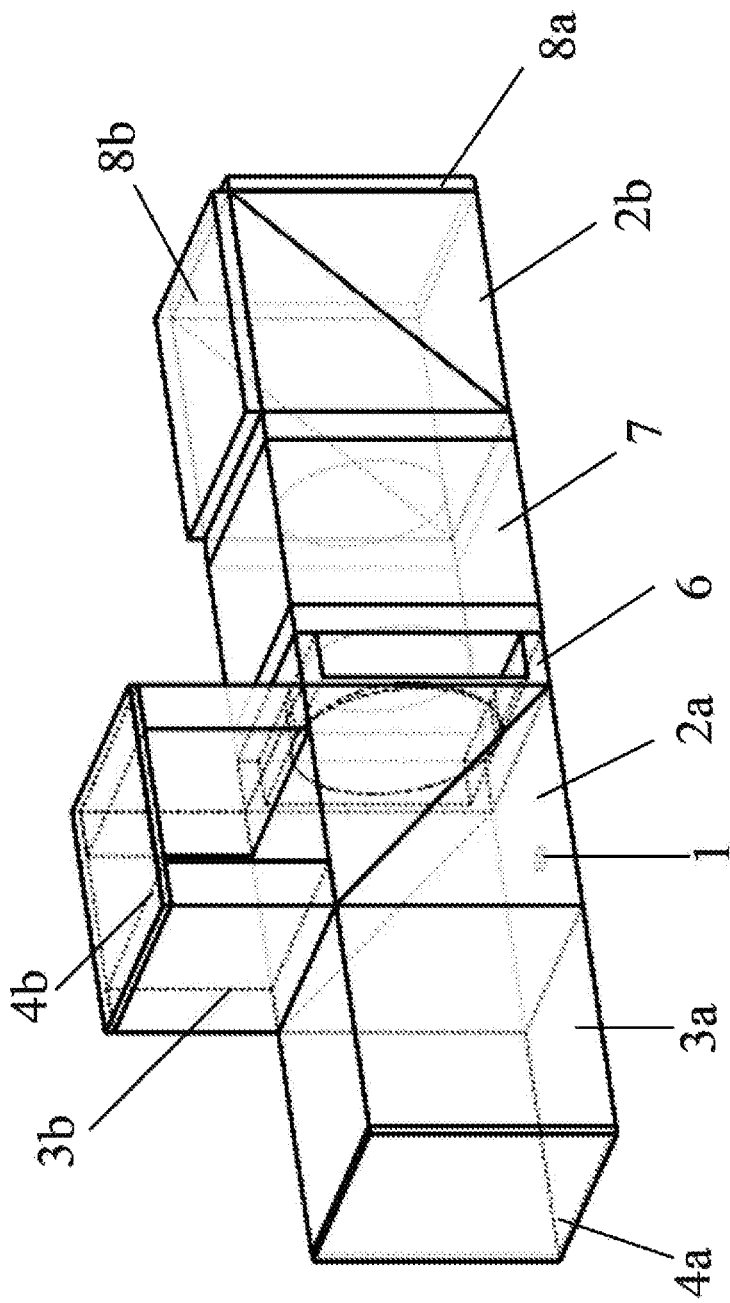
FIG. 2A is a perspective view of a sensor probe according to one embodiment of the disclosure.
Figure 2B:
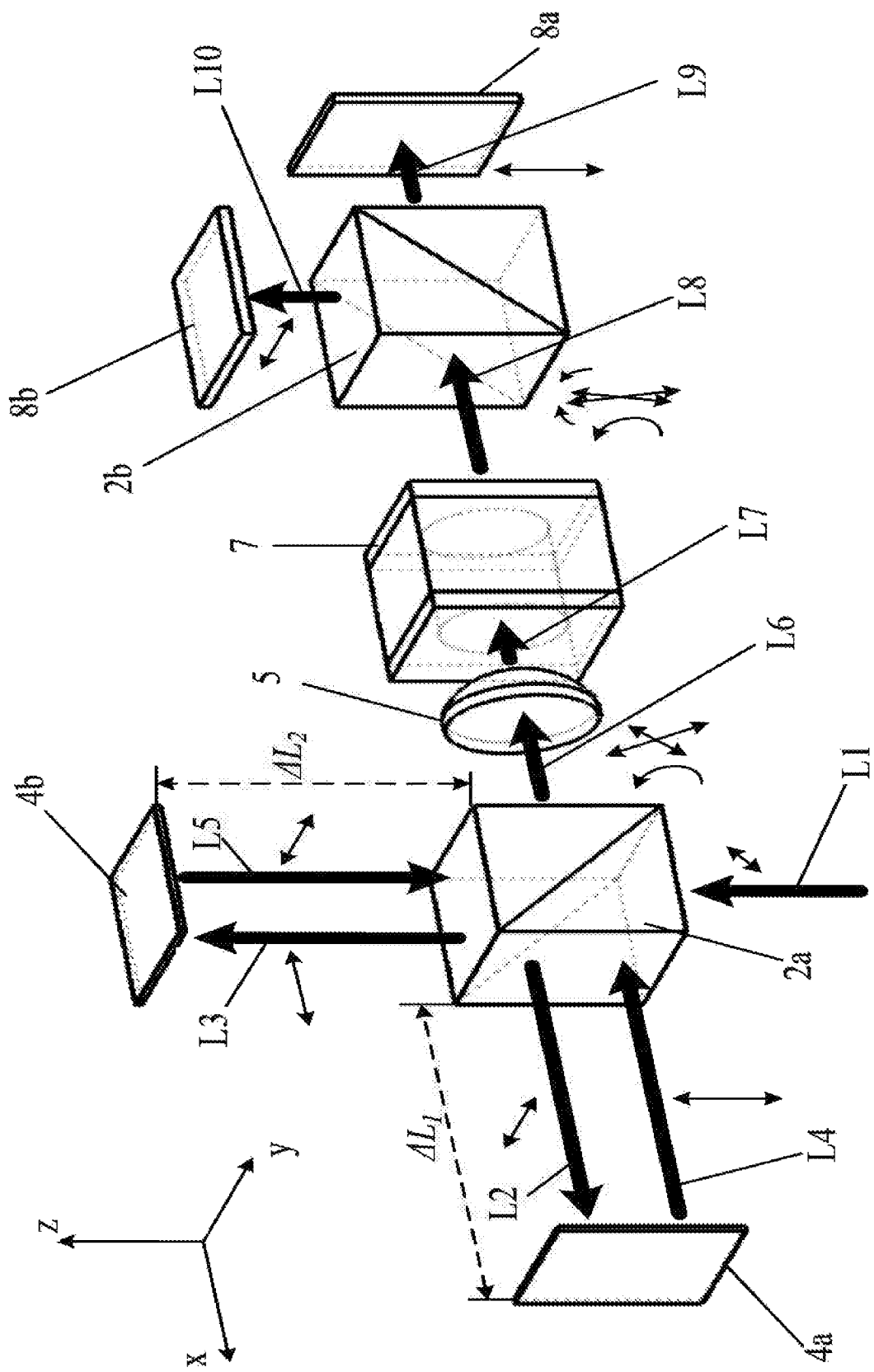
FIG. 2B is a polarization change and detection principle of a laser beam in the probe of the sensor according to one embodiment of the disclosure.

FIG. 2A is a perspective view of a structure of a sensor probe as described in the disclosure. FIG. 2B is a polarization change and detection principle of the light in the probe of the sensor (taking the light at the fundamental frequency in the outgoing light as a right-handed circularly polarized light as an example). The polarization direction of all frequency components in the outgoing light L1 from the VCSEL 1 is $(x+y)/\sqrt{2}$. The outgoing light L1 is split into two beams of the same power by the first PBS 2a: that is, the laser beam L2 reflected by the first PBS and the laser beam L3 transmitted by the first PBS. The polarization direction of the laser beam L2 reflected by the first PBS is y. The laser beam L2 reflected by the first PBS first passes through the optical gasket (quartz) 3a, and then passes through the wave plate portion of the first quarter-wave plate 4a, the reflection surface and the wave plate portion in order, and thus is converted into the laser beam L4 reflected by the optical gasket. The fast-axis direction of first quarter-wave plate 4a is $(z+y)/\sqrt{2}$ or $(z-y)/\sqrt{2}$, so that the laser beam L4 reflected by the optical gasket passes through the polarization reflection surface of the first PBS 2a. The polarization direction of the laser beam L3 reflected by the first PBS is x. The laser beam L3 reflected by the first PBS first passes through the hollow gasket (quartz) 3b, and then passes through the wave plate portion of the second quarter-wave plate 4b, the reflection surface and the wave plate portion in order, and thus is converted into the laser beam L5 reflected by the hollow gasket. The fast-axis direction of second quarter-wave plate 4b is $(x+y)/\sqrt{2}$ or $(x-y)/\sqrt{2}$, so that the laser beam L5 reflected by the hollow gasket is reflected by the polarization reflection surface of the first PBS 2a. The laser beam L4 reflected by the optical gasket and the laser beam L5 reflected by the hollow gasket are combined on the polarization reflection surface of the first PBS 2a to generate a combined divergent laser beam L6. The combined divergent laser beam L6 is converted into a combined parallel laser beam L7 through a lens 5. The combined parallel laser beam L7 becomes the laser beam L8 after interacting with alkali metal atoms in the atomic vapor cell 7 after passing through the atomic vapor cell 7. The laser beam L8 after interacting with alkali metal atoms in the atomic vapor cell 7 is subjected to polarization analysis by the second PBS 2b, and thus is divided into two beams. The transmitted component L9 for polarization analysis is detected by the first photodetector 8a, and the reflected component L10 for polarization analysis is detected by the second photodetector 8b.

The principle of the polarization converter 9 is as follows:

The laser beam L4 reflected by the optical gasket and the laser beam L5 reflected by the hollow gasket interfere with each other when the two laser beams are combined on the polarization reflection surface of the first PBS 2a. The polarization of the combined divergent laser beam L6 is determined by the optical path difference in the propagation process of the laser beam from the splitting to the superposition. The quarter-wave plate 4a and the second quarter-wave plate 4b, have the same size, and thus a half of the total optical path difference is $\Delta L = n_0 \times d_1 - d_2$. But the light with different frequency components has different phase differences when passing through the same optical path difference, resulting in different polarizations of different sideband components in the combined divergent laser beam L6. The combined divergent laser beam L6 includes a fundamental frequency with a frequency $f_0$, a negative first-order sideband with a frequency $f_{-1}$, and a positive first-order sideband with a frequency $f_{+1}$. The $f_0$, $f_{-1}$ and $f_{+1}$ must satisfy the following equations: $f_{+1} = f_0 + f_m$, $f_{-1} = f_0 - f_m$, where $f_m$ is a modulation frequency of the laser. The objective of the disclosure is to convert the fundamental frequency with a frequency $f_0$ in the combined divergent laser beam L6 into right-handed circularly polarized light with a polarization direction of $(z - i \times y)/\sqrt{2}$, and convert the negative first-order sideband with a frequency $f_{-1}$, and the positive first-order sideband with a frequency $f_{+1}$ into two linear polarized lights that are mutually perpendicular to each other and have the same polarization direction of $(z \pm y)/\sqrt{2}$.

To convert the fundamental frequency with a frequency $f_0$ into right-handed circularly polarized light, $\Delta L$ must satisfy the following formula:

$$\Delta L = (2 \times n + 1) \times c/(4 \times f_0) \qquad (1)$$

where c is the speed of light and n is a non-negative odd number: that is, $\Delta L$ is a series of values related to f0. The fundamental frequency light of frequency $f_0$ resonates with the atoms to achieve optical pumping.

For example, the ground state F=2 with the energy level D1 transitions to the excited state F'=2 when 87Rb is used as the alkali metal atoms, and the center frequency $f_c$ of the transition is about 377104 GHz. And to convert the positive first-order sideband light and negative first-order sideband light into two linearly polarized lights that are mutually perpendicular to each other, $\Delta L$ must satisfy the following formula:

$$\Delta L = c/(8 \times f_m) \qquad (2).$$

For example, when the modulation frequency $f_m$=15 GHz, $\Delta L$=5 mm can be obtained according to the formula (2). For selected $f_0$ and $f_m$, formulas (1) and (2) may not hold at the same time. The formula (1) is hardly achieved because it is difficult to control $\Delta L$ according to the laser wavelength and dimensional accuracy when processing the probe. However, when the laser is in the range of the center frequency $\pm f_w$ of the transition, the absorption of the fundamental frequency light by the atoms is basically unchanged due to the broadening of the spectral line. Especially in chip-scale atomic sensors, it is necessary to heat the atomic vapor cell 7 to a very high temperature, and the atomic vapor cell 7 is filled with a buffer gas, and $f_w$ can reach several GHz, even more than 10 GHz. In the actual manufacturing process of the probe, $\Delta L' \approx 5$ mm can be processed first to make formula (2) hold approximately. Then the fundamental frequency $f_0'$ of the laser is adjusted within the range of $f_c - f_w$ to $f_c + f_w$ so that the formula (1) approximately holds. A laser beam similar to the target light can thus be obtained by using this method. After determining $\Delta L' \approx 5$ mm, it is easy to determine the actual dimensions of other devices. For example, when the optical gasket 3a comprises glass having a refractive index of $n_0$=1.5, the two simultaneous equations $d_1 = n_0 \times d_2$ and $\Delta L = n_0 \times d_1 - d_2$ can be solved to obtain $d1' \approx 3$ mm and $d2' \approx 2$ mm. When the half divergence angle φ of VCSEL 1 in vacuum is 7.5° and the side length of the first PBS 2a is 3 mm, the focal length of the lens is about 9 mm, and the diameter of the combined parallel laser beam L7 is about 2 mm. The diameter of the light passing hole in the atomic vapor cell 7 is preferably 2 mm.

The detection principle is as follows: the combined parallel laser beam L7 comprises a right-handed circularly polarized light converted from a fundamental frequency light at a frequency $f_0'$, and two linearly polarized lights that are mutually perpendicular to each other converted from the positive first-order sideband light of a frequency $f_{+1}$ and negative first-order sideband light of a frequency $f_{-1}$. The alkali metal atoms in the atomic vapor cell 7 are polarized by absorbing the component light of a frequency $f_0'$ in the combined parallel laser beam L7. But the component light of a frequency $f_0'$, that is, circularly polarized light, has no change in polarization. When the two linearly polarized lights respectively with frequencies $f_{-1}'$ and $f_{+i}'$ in the combined parallel laser beam L7 pass through the atomic vapor cell 7, the polarized atoms cause the polarization plane of the linearly polarized light to rotate by a particular angle. The rotation angle is related to the angular rate of rotation of the magnetic field to be measured or the sensors, and the linearly polarized light respectively with frequencies $f_{-1}'$ and $f_{+i}'$ rotate in each of opposed rotation directions. The laser beam L8 after interacting with alkali metal atoms in the atomic vapor cell includes an unabsorbed circularly polarized light of a frequency $f_0'$ and two rotated linearly polarized lights of frequencies $f_{-1}'$ and $f_{+1}'$. The circularly polarized light with a frequency of $f_0'$ is split into two beams of equal power by the second PBS 2b, and the two rotated linearly polarized lights respectively with frequencies $f_{-1}'$ and $f_{+1}'$ is split into two powers of unequal power by the second PBS 2b. For example, as shown in the rotation direction of the polarization in FIG. 2B, the optical power of the transmitted component L9 for polarization analysis will be greater than the optical power of the reflected component L10 for polarization analysis. The output from the two photodetectors is subtracted each other to obtain a differential signal. The differential signal is a sum signal of polarization rotations of two component lights at frequencies $f_{-1}'$ and $f_{+1}'$, and is defined as a signal sensitive to the angular rate of rotation of a magnetic field or a sensor.

Figure 3:
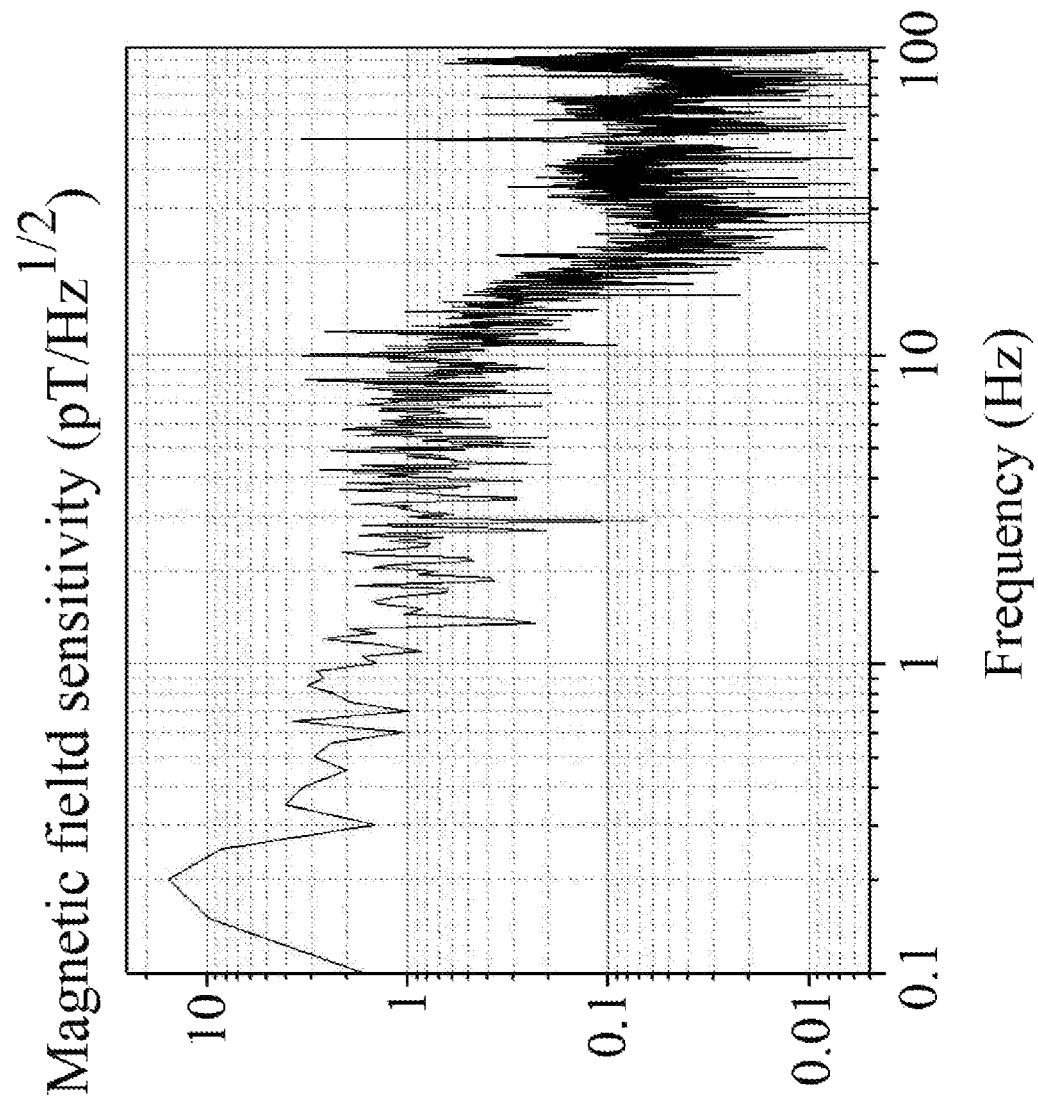
FIG. 3 is a diagram of sensitivity signal obtained by experiments using the solution of the disclosure.

In the disclosure, the circularly polarized light converted from the fundamental frequency resonates with the alkali metal atoms to polarizes the alkali metal atoms by optical pumping. Linearly polarized light converted from the positive and negative first-order sidebands is detuned with the atoms to detect the polarization of the atoms. The fundamental frequency used in this disclosure is the original laser frequency. The difference between the positive and negative first-order sideband frequencies and the fundamental frequency is defined as a modulation frequency. The distribution of the light intensity between the fundamental frequency and the positive and negative first-order sideband components is determined by a modulation depth. Therefore, it is convenient to obtain a circularly polarized light of the fundamental frequency that can resonate with the transition frequency of the alkali metal atoms, and also obtain two linearly polarized lights respectively having positive and negative first-order sidebands with an optimal detuning frequency. The interaction between the detuned light detuned light and the alkali metal atoms result in a negative impact on the detection accuracy because the optical frequency shift of the atomic transition spectrum occurs. The frequency shift caused by the polychromatic light with symmetrical frequency detuning of the positive and negative sidebands is much weaker than that of the single-sided detuning of the circular-line dual laser beam. As shown in FIG. 3, the disclosure achieves a sensitivity of 1 $pT/\sqrt{Hz}$.

It will be obvious to those skilled in the art that changes and modifications may be made, and therefore, the aim in the appended claims is to cover all such changes and modifications.

What is claimed is:

1. A method, comprising:
   1) providing a polarization converter;
   2) emitting a linearly polarized polychromatic laser beam to the polarization converter;
   3) converting, by the polarization converter, the linearly polarized polychromatic laser beam into a circularly-polarized laser beam and a linearly-polarized laser beam;
   4) combining the circularly-polarized laser beam and the linearly-polarized laser beam thereby yielding a multi-polarization polychromatic laser beam;
   5) transmitting the multi-polarization polychromatic laser beam to an atomic vapor cell comprising alkali metal atoms;
   6) polarizing the multi-polarization polychromatic laser beam into two laser beams; and
   7) detecting the two laser beams by two photodetectors, respectively.

2. The method of claim 1, wherein in 2), the linearly polarized polychromatic laser beam is emitted by a vertical cavity surface emitting laser (VCSEL).

3. The method of claim 2, wherein the linearly polarized polychromatic laser beam comprises a fundamental frequency component, a negative first-order sideband, and a positive first-order sideband; the fundamental frequency component is converted by the polarization converter into the circularly-polarized laser beam, and the negative and positive first-order sidebands are converted by the polarization converter into the linearly-polarized laser beam with two polarization directions perpendicular to each other.

4. The method of claim 1, wherein the linearly polarized polychromatic laser beam comprises a fundamental frequency, a negative first-order sideband frequency, and a positive first-order sideband frequency; the fundamental frequency component is converted by the polarization converter into the circularly-polarized laser beam, and the negative and positive first-order sidebands are converted by the polarization converter into the linearly-polarized laser beam with two polarization directions perpendicular to each other.

5. A device, comprising:
   a polarization converter comprising a first polarization beam splitter;
   an atomic vapor cell comprising alkali metal atoms;
   a second polarization beam splitter;
   a first photodetector; and
   a second photodetector;
wherein:
   the polarization converter, and the first photodetector and the second photodetector are disposed on two sides of the atomic vapor cell, respectively;
   the polarization converter is configured to convert a linearly polarized polychromatic laser beam into a circularly-polarized laser beam and a linearly-polarized laser beam with two polarization directions perpendicular to each other;
   the circularly-polarized laser beam and the linearly-polarized laser beam are combined to yield a multi-polarization polychromatic laser beam;
   the atomic vapor cell is configured to receive the multi-polarization polychromatic laser beam;

the second polarization beam splitter is configured to polarize the multi-polarization polychromatic laser beam into two laser beams; and the first photodetector and the second photodetector are configured to detect the two laser beams by two photodetectors, respectively.

6. The device of claim 5, wherein the first polarization beam splitter comprises a reflection optical path and a transmission optical path; the polarization converter comprises a first reflection waveplate and a second reflection waveplate disposed on the reflection optical path and the transmission optical path, respectively.

7. The device of claim 6, wherein a first optical gasket is disposed between the first reflection waveplate and the first polarization beam splitter, and a second optical gasket is disposed between the second reflection waveplate and the first polarization beam splitter.

8. The device of claim 6, wherein the device further comprises a vertical cavity surface emitting laser disposed on the first polarization beam splitter.

9. The device of claim 5, wherein a lens is disposed between the polarization converter and the atomic vapor cell, and the lens is configured to convert a divergent light into a parallel light and output.

10. The device of claim 5, wherein the device further comprises a vertical cavity surface emitting laser disposed on the first polarization beam splitter.

11. The device of claim 5, wherein every two adjacent optical elements of the device are adhered to one another.

* * * * *